(12) United States Patent
Moon

(10) Patent No.: US 7,474,410 B2
(45) Date of Patent: Jan. 6, 2009

(54) NANOMETER-PRECISION TIP-TO-SUBSTRATE CONTROL AND PATTERN REGISTRATION FOR SCANNING-PROBE LITHOGRAPHY

(75) Inventor: Euclid E. Moon, Boston, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 51 days.

(21) Appl. No.: 11/733,851

(22) Filed: Apr. 11, 2007

(65) Prior Publication Data

US 2007/0234786 A1   Oct. 11, 2007

Related U.S. Application Data

(60) Provisional application No. 60/790,910, filed on Apr. 11, 2006.

(51) Int. Cl.
*G01B 11/02* (2006.01)
(52) U.S. Cl. .................................................. 356/501
(58) Field of Classification Search ................. 356/501, 356/505, 508
See application file for complete search history.

(56) References Cited

U.S. PATENT DOCUMENTS

| | | | |
|---|---|---|---|
| 5,414,514 A | | 5/1995 | Smith et al. |
| 6,088,103 A | | 7/2000 | Everett et al. |
| 6,118,521 A | * | 9/2000 | Jung et al. .................. 356/73 |
| 6,522,411 B1 | | 2/2003 | Moon et al. |
| 6,677,697 B2 | | 1/2004 | Struckmeier et al. |
| 7,247,843 B1 | * | 7/2007 | Moon ..................... 250/237 G |
| 2003/0110844 A1 | | 6/2003 | Struckmeier et al. |
| 2004/0231177 A1 | | 11/2004 | Mies |
| 2006/0033024 A1 | | 2/2006 | Sparks et al. |
| 2007/0103697 A1 | * | 5/2007 | Degertkin ................. 356/501 |

FOREIGN PATENT DOCUMENTS

| | | |
|---|---|---|
| DE | 4221989 A1 | 1/1994 |
| DE | 4221989 C2 | 1/1994 |
| EP | 0398334 | 11/1990 |
| EP | 1617293 | 1/2006 |
| WO | 2004112050 | 12/2004 |

OTHER PUBLICATIONS

Moon et al., "Interferometric-spatial-phase imaging for six-axis mask control," XP-002453436, J. Vac. Sci. Technol. Nov./Dec. 2003, American Vacuum Society, pp. 3112-3115.

Moon et al., "Nanometer-precision pattern registration for scanning-probe lithographies using interferometric-spatial-phase imaging," XP-002453437, J. Vac. Sci. Technol. Nov./Dec. 2006, American Vacuum Society, pp. 3083-3087.

* cited by examiner

*Primary Examiner*—Michael A Lyons
(74) *Attorney, Agent, or Firm*—Gauthier & Connors LLP

(57) ABSTRACT

An interferometric-spatial-phase imaging (ISPI) system includes an alignment mechanism for obtaining continuous six-axis control of a scanning probe tip with respect to a coordinate system attached to a substrate. A gap detection mechanism measures tip height above a substrate and controls tip approach toward the substrate of one or more tips, as well as measures tip deflection during surface contact of the one or more tips. A plurality of complementary marks is provided for attachment to the one or more tips. A plurality of grating marks is provided to backdiffract a reflected beam from a flexible cantilever to detect high-frequency tip deflection in a compact configuration of a light source and a light detector.

33 Claims, 9 Drawing Sheets

NANOMETER-PRECISION TIP-TO-SUBSTRATE CONTROL AND PATTERN REGISTRATION FOR SCANNING-PROBE LITHOGRAPHY

PRIORITY INFORMATION

This application claims priority from provisional application Ser. No. 60/790,910 filed Apr. 11, 2006, which is incorporated herein by reference in its entirety.

BACKGROUND OF THE INVENTION

The invention relates to the field of interferometric-spatial-phase imaging (ISPI), and in particular to nanometer-precision referencing of a scanning probe tip to a substrate.

Since the invention of the scanning probe microscope in 1981, tip position has been subject to drift and perturbations that introduce disparities between the tip position and its intended position on a Cartesian grid. Tip perturbations degrade the quality of scanned images. Of more significance is the application to scanning probe lithography, which has been shown to write sub-5 nm features, and manipulate single molecules. Precise tip control, a priori, and contemporaneous to lithographic patterning, is essential for viable lithography at the extreme limit of molecular patterning.

SUMMARY OF THE INVENTION

According to one aspect of the invention, there is provided an interferometric-spatial-phase imaging (ISPI) system. The ISPI system includes an alignment mechanism for obtaining continuous six-axis control of a scanning probe tip with respect to a coordinate system attached to a substrate. A gap detection mechanism measures tip height above a substrate and controls tip approach toward the substrate of one or more tips, as well as measures tip deflection during surface contact of the one or more tips. A plurality of complementary marks is provided for attachment to the one or more tips. A plurality of grating marks is provided to backdiffract a reflected beam from a flexible cantilever to detect high-frequency tip deflection in a compact configuration of a light source and a light detector.

According to another aspect of the invention, there is provided a scanning microscope. The scanning microscope includes an alignment mechanism for obtaining continuous six-axis control of a scanning probe tip with respect to a coordinate system attached to a substrate. A gap detection mechanism measures tip height above a substrate and controls tip approach toward the substrate of one or more tips, as well as measures tip deflection during surface contact of the one or more tips. A plurality of complementary marks is provided for attachment to the one or more tips. A plurality of grating marks is provided to backdiffract a reflected beam from a flexible cantilever to detect high-frequency tip deflection in a compact configuration of a light source and a light detector.

According to another aspect of the invention, there is provided a method of interferometric-spatial-phase imaging. The method includes obtaining continuous six-axis control of a scanning probe tip with respect to a coordinate system attached to a substrate with an alignment mechanism; measuring tip height above a substrate and controlling tip approach to the substrate of one or more tips, as well as measuring tip deflection during surface contact of the one or more tips with a gap detection mechanism; providing a reference flat that includes a plurality of marks for alignment and gap control of the one or more tips relative to the substrate, as well as for orientation of the one or more tips; providing a plurality of complementary marks for alignment on the substrate; and providing a plurality of grating marks to backdiffract a reflected beam from a flexible cantilever to detect high-frequency tip deflection in a compact configuration of a light source and a light detector.

DETAILED DESCRIPTION OF THE INVENTION

The invention relates to a technique for direct, nanometer-precision referencing of a scanning probe tip to a substrate, using Interferometric-Spatial-Phase Imaging (ISPI), which is being applied to template alignment and gap control.

Figure 1:
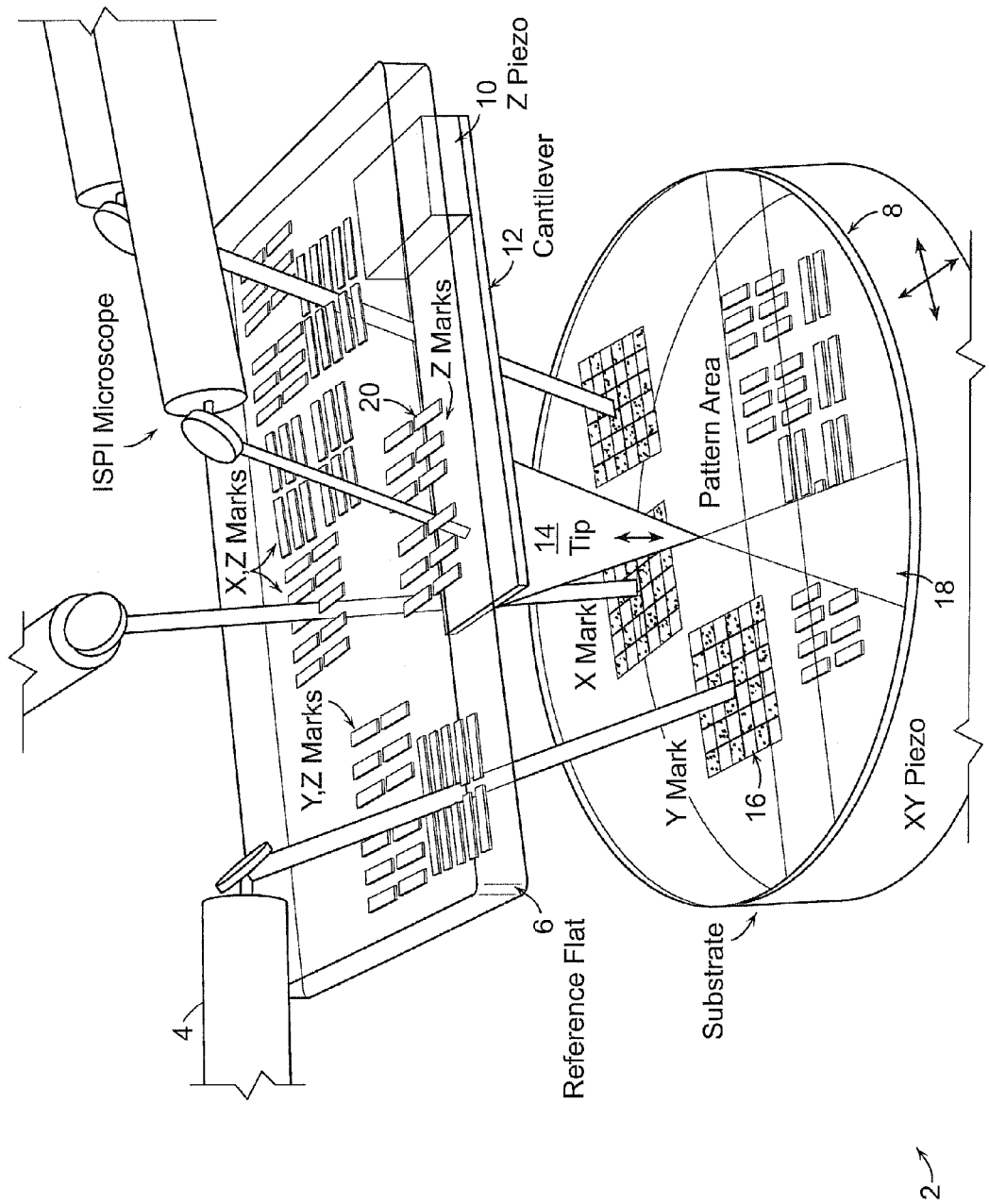
FIG. 1 is a schematic diagram of the inventive tip position control apparatus.

In accordance with an exemplary embodiment of the invention, a probe tip 14 is attached to a transparent, planar support structure 6, such as a fused silica plate, referred to herein as a reference flat, containing grating patterns. Checkerboard marks 16 form complementary patterns on the substrate 8, as illustrated in FIG. 1. The marks 16 are illuminated with spatially-coherent light at an oblique angle and interference patterns encoding position are detected with darkfield microscopes at a similar angle produced by ISPI microscopes 4. The measurements are used to control the lateral position of the tip 14 with respect to the substrate 8.

During lithography, the substrate 8 is scanned underneath the tip in X and Y directions, while the tip height is modulated with a Z piezo 10, attached between the reference flat 6 and a probe cantilever 12. Throughout the X-Y scan by the substrate 8, the position of the reference flat 6 (and hence the tip position) is referenced to the substrate 8 position using ISPI marks 16, allowing continuous correction for thermal drift and other errors.

Direct referencing is provided by ISPI marks attached to the reference flat 6 and substrate 8. ISPI microscopes 4 observe interference fringes from marks, yielding X and Y position, as well as gaps between the reference flat 6 and the substrate 8. The probe tip 14 is attached to the reference flat 6 with a small gap between the cantilever 12 and the flat 6, allowing tip deflection and Z actuation via an integrated piezo 10. Tip deflection is detected by another ISPI microscope in the preferred embodiment, observing gapping marks 20 above the cantilever 12. The scanning tip 14 modifies a surface layer 18 on the substrate 8, under continuous ISPI position control.

Figure 2:
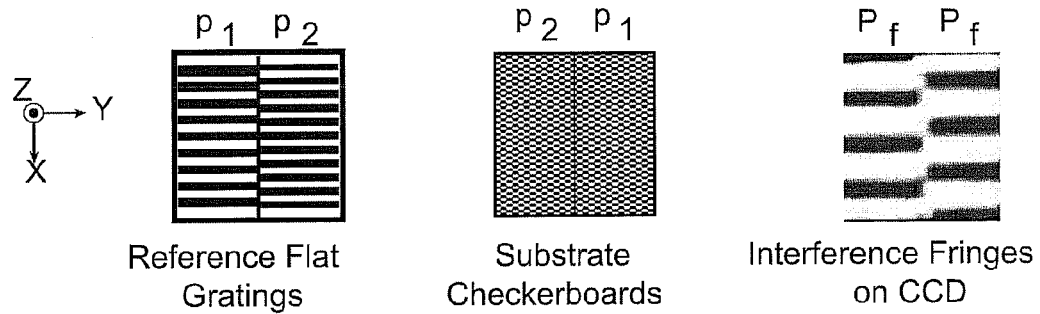
FIG. 2 is a schematic diagram illustrating ISPI marks used in accordance with the invention.

Details of the lateral position detection marks are shown in FIG. 2. Interference fringes are generated through multiple diffractions and subsequent interference, as described in U.S. Pat. Nos. 5,414,514 and 6,088,103, which are incorporated herein by reference. Tip position is encoded in the spatial phase relation between matched sets of interference fringes. A separate set of marks detects displacement along each axis.

FIG. 2 illustrates marks viewed with a microscope oriented in the Y-Z plane. In a preferred embodiment $p_1$=2.00 μm and $p_2$=2.05 μm. The checkerboard period in the Y-direction is 1.00 μm. The fringe period is $P_f$=41.00 μm. The illumination wavelength is typically in the range of 670-690 nm. The reversal of $p_1$ and $p_2$ on the upper and lower surfaces results in counter-motion of the fringes during displacement, and doubles the sensitivity. Angular misalignment is evidenced by rotation of the fringes in opposite directions, forming a chevron pattern.

Figure 3:
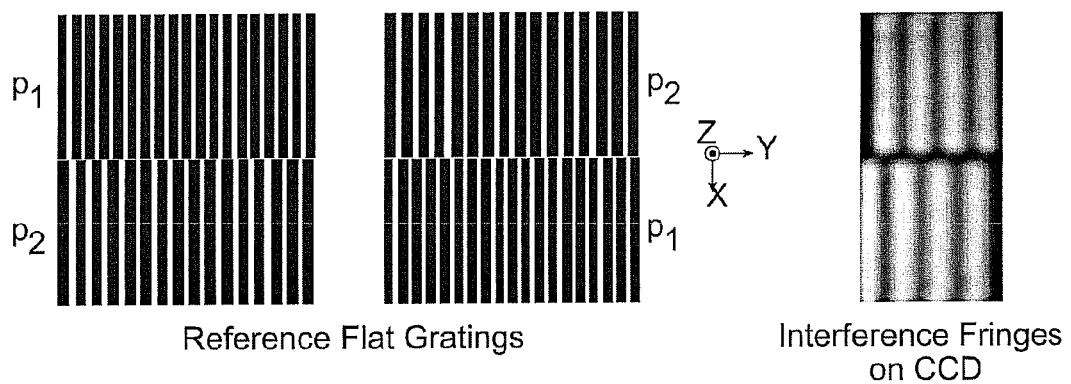
FIG. 3 is a schematic diagram of a Long-Range Interferometric Gapping (LRIG) marks, and a CCD image of the resulting interference fringes created in the region of overlapping backdiffracted and reflected beams when in proximity with a substrate.

FIG. 3 shows a schematic diagram of a design of Long-Range Interferometric Gapping (LRIG) marks, and a CCD image of the resulting interference fringes created in the region of overlapping backdiffracted and reflected beams when in proximity with a substrate. The gap is encoded in the spatial phase relation of the interference fringes. The marks are required only on the reference flat. The marks are viewed with a microscope oriented in the Y-Z plane. In the preferred embodiment, $p_1$=1.000 μm and $p_2$=1.025 μm.

The gap between the reference flat and the substrate is also monitored by ISPI microscopes. In the preferred embodiment, one set of ISPI gapping marks, such as Transverse Chirp Gapping (TCG) marks or LRIG marks, can be viewed by the same camera, and in the same field of view, as the lateral position detection marks. Transverse Chirp Gapping (TCG) marks are described in U.S. Pat. No. 6,522,411, which is incorporated herein by reference. All six degrees of freedom (X, Y, Z, $\theta_x$, $\theta_y$, $\theta_z$) can be measured or derived simultaneously with three ISPI microscopes. Tip height relative to the reference flat is detected with another ISPI microscope and TCG or LRIG marks above the cantilever.

ISPI gapping marks, such as TCG or LRIG marks, are used for accurate, rapid, and safe approach of the tip to the substrate. In a typical scanning probe system, an optical microscope is used to manually focus on the surface of the substrate and on the backside of the cantilever. Based on the difference in focal heights, the tip is moved into proximity with the substrate, and then the tip is scanned in Z to eventually contact the surface, as indicated by tip deflection. This is a time-consuming procedure, due in part to the relatively large uncertainty inherent to the focal distance measurements. In contrast, ISPI-based gapping measurements allow sub-nanometer detectivity of the relative height of the substrate and cantilever. The distance from the point of the tip to the substrate can be derived from the tip-flat and flat-substrate distance measurements and the known tip length, defined by fabrication or based upon prior measurements of the height of tip-substrate contact.

Tip deflection is measured during tip-substrate contact, and in combination with the lateral ISPI measurements, can be used for generation of high-accuracy, large-area scanned images, as in scanning probe microscopy, and confirmation of initial tip-substrate contact and duration, as is beneficial for mechanical coordination of the scanning stage and tip position, and as required for accurate lithographic registration. The use of ISPI X, Y, and Z-detection marks does not exclude the use of traditional reflected-laser/quadrant-photodetector methods of detecting tip deflection.

Figure 4:
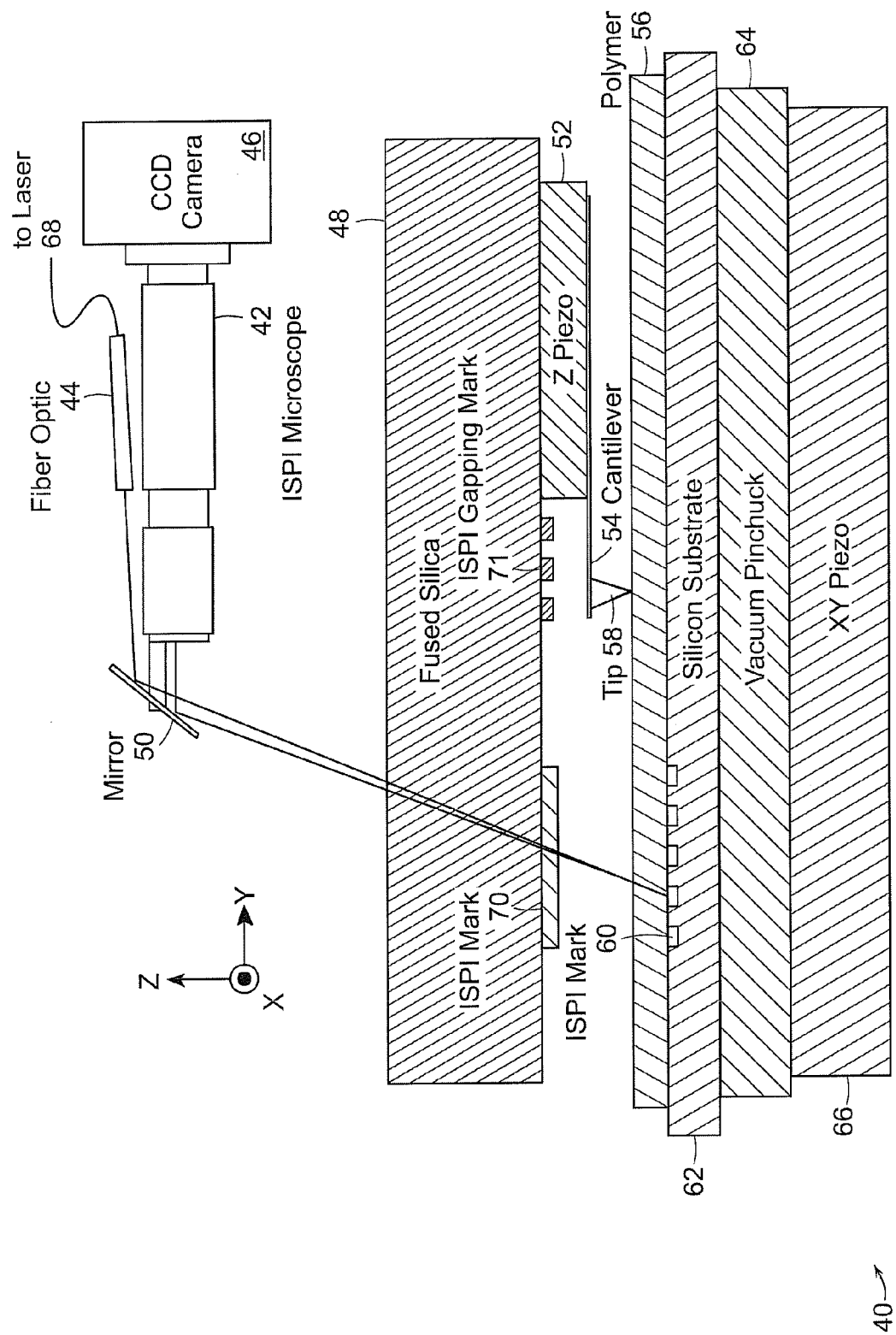
FIG. 4 is a schematic diagram illustrating a cross-sectional view of a tip and ISPI marks.

FIG. 4 shows further details in a cross-sectional view of one of said ISPI microscopes and an alignment mark. The arrangement 40 includes an ISPI microscope 42 that is attached to a CCD camera 46 that receives reflected optical signals from a mirror 50. A laser 68 is connected to a fiber optic device 44 to form a single mode laser beam. The fiber optic device 44 sends incident light to the mirror 50 to be sent to ISPI checkerboard marks 60. A probe tip 58 is attached to a transparent, planar support structure 48, such as a fused silica plate, a reference flat, containing ISPI marks 70 and gapping marks 71. During lithography, the substrate 62 is scanned underneath the tip in X and Y directions, while the tip height is modulated with a Z piezo 52, attached between the reference flat 48 and a probe cantilever 54. The substrate 62 includes ISPI checkerboard marks 60 as well. In this embodiment, a vacuum pinchuck 64 is positioned on the X-Y piezo 66. Note in this embodiment the surface 56 being scanned is a polymer, however other surfaces can be used.

Additional ISPI microscopes can observe gap-detection marks and alignment in the orthogonal direction. The cross-section shown in FIG. 4 is in the incident plane. The transverse plane is orthogonal to the incident plane, and inclined at the Littrow angle ($\theta_L$=$\sin^{-1}(\lambda/(2p))$). Note that in the preferred embodiment, the ISPI microscope utilizes external illumination, in which case the incident and return beams bisect the Littrow angle. Illumination is from a single-mode, fiber-coupled laser. The microscope optics are low-NA, with an optical resolution limit only slightly smaller that the ISPI fringe period, $P_f$.

The ISPI microscope 42 and mark configuration is unchanged between the scanning probe tip application and alignment and overlay of templates. Nanometer feature resolution using a scanning probe is provided by commercially-available tips with self-assembled diamondoid additions onto a normal, silicon tip. The tip radius is ~1 nm. Note that the placement of the ISPI marks in the preferred embodiment can be reversed: checkerboard marks 60 can be placed on the reference flat 48, and the grating marks 70 on the substrate 62. This configuration is less preferable, due to lower fringe contrast caused by a double pass of illumination through the checkerboard, however it is a feasible alternative.

Figure 5B:
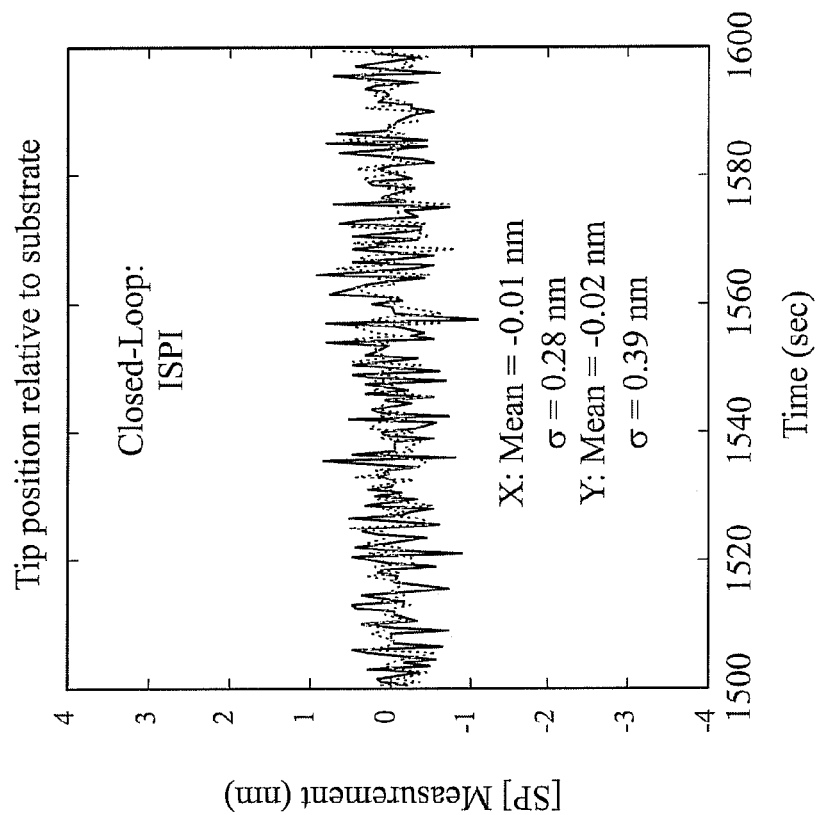
FIG. 5B is a graph demonstrating data taken using ISPI for position control of a tip relative to a substrate.
Figure 5A:
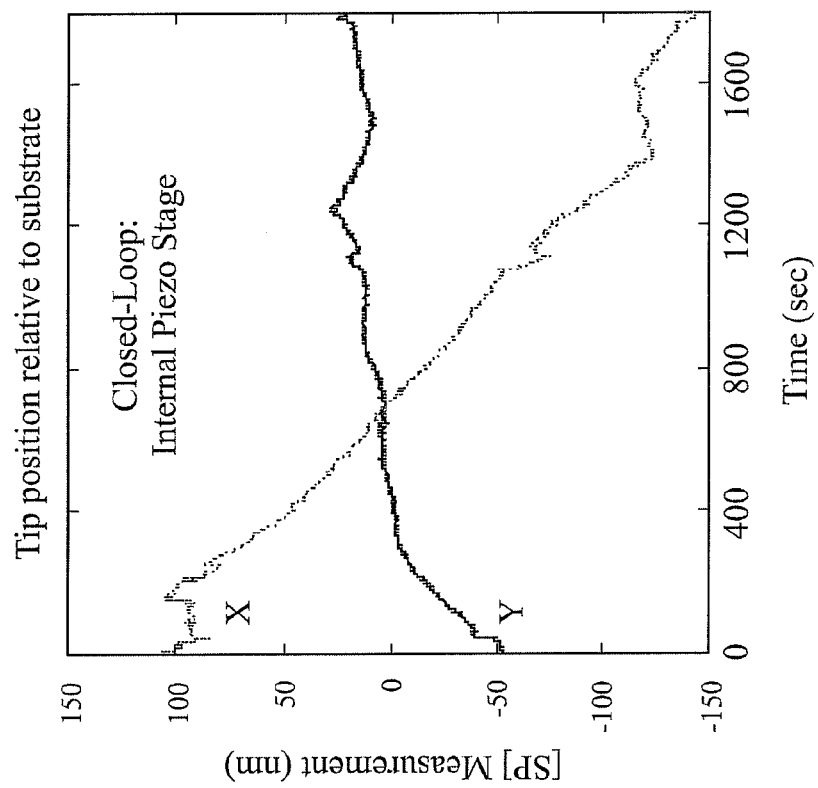
FIG. 5A is a graph demonstrating data of tip position relative to a closed-loop piezo stage.

FIG. 5A shows drift between a tip and a substrate when an XY piezo stage is controlled using internal feedback. The piezo feedback system in FIG. 5A stabilizes the substrate position with respect to an internal frame of reference to <1 nm during the data acquisition, yet drift of >100 nm occurs between the tip and substrate. In contrast, FIG. 5B shows feedback stabilization of tip-substrate position using ISPI, which is controlled for arbitrarily long times with mean <0.1 nm and σ<0.5 nm.

Figure 6B:
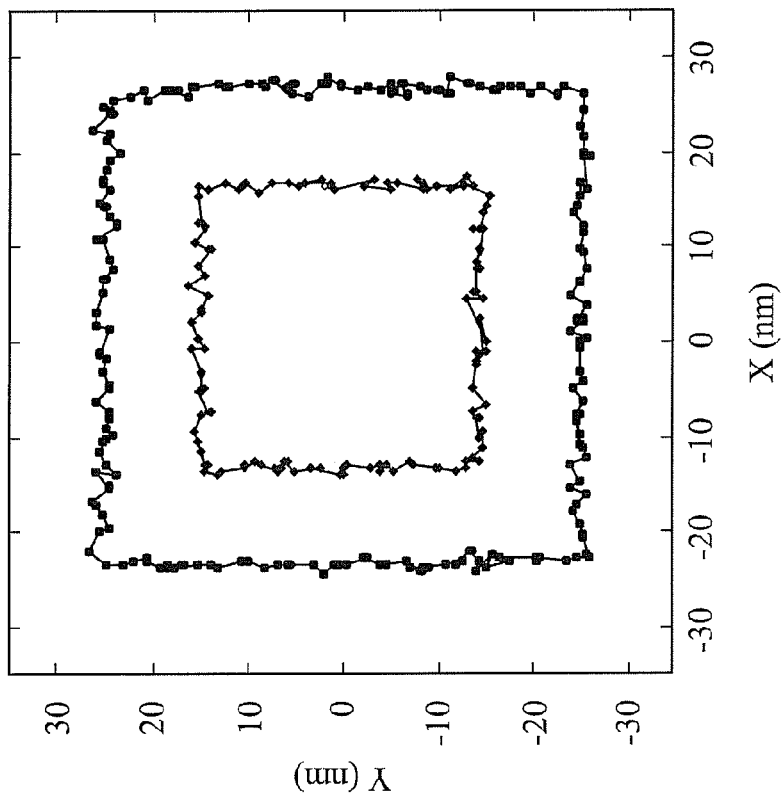
FIG. 6B is a graph illustrating the tip position data acquired under ISPI control, with air in the gap.
Figure 6A:
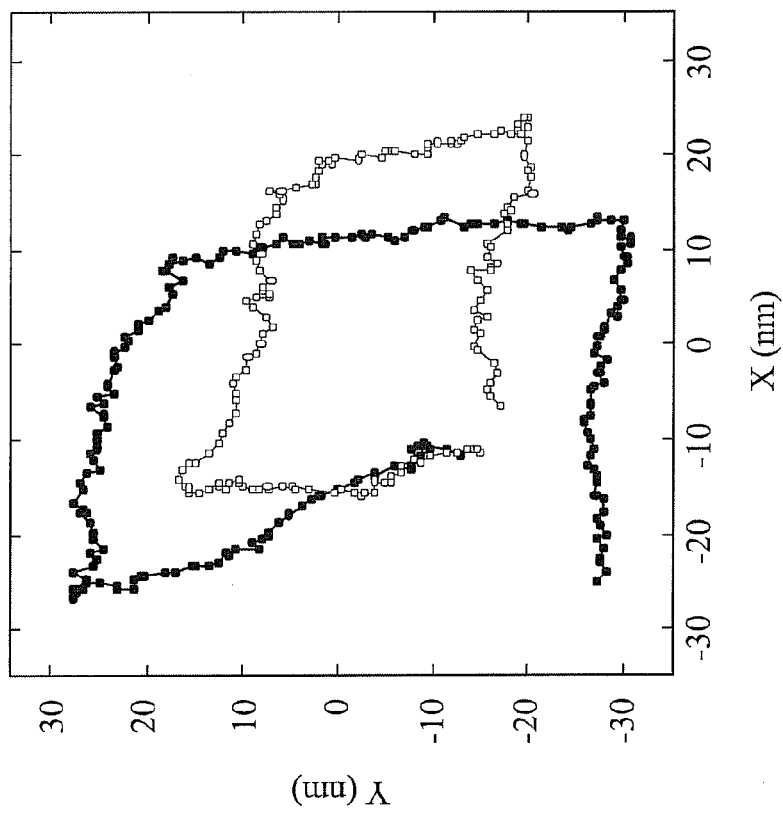
FIG. 6A is a graph illustrating the ISPI measurements taken during tip motion, controlled by internal piezo-stage sensors, describing nominally square patterns of 50 nm and 30 nm, with a nominally common center.

Registration of multiple, nested patterns is indicated experimentally in FIGS. 6A-6B. To demonstrate the ability to pattern arbitrary features with minimal pattern distortions, a set of square boxes with 50 nm and 30 nm dimensions was traced out by the tip. FIG. 6A indicates the traces while using the internal piezo feedback, and FIG. 6B shows the same patterns traced out while feeding back to the ISPI signals.

Measurements on the ISPI-controlled traces demonstrate registration of subsequent patterns. In addition, the data indicates that tip-substrate drift is suppressed in overlaid patterns to ~1 nm, albeit with noise from vibrations still present in the system.

Mechanical stability can be improved by using smaller, stiffer structures connecting the reference flat and substrate. However, the requirement of using short mechanical paths is in conflict with large travel range, as required for large-area patterning.

In further embodiments of the invention, a tip is immersed in a fluid, and held in the small gap between the two parallel surfaces, consisting of the reference flat and the substrate. The primary function of the fluid is to mechanically stabilize the relative position of the tip and substrate, without limiting travel range. The fluid provides a viscous layer that damps out high-frequency vibration, yet permits nearly unlimited lateral motion of the scanning stage.

Figure 7B:
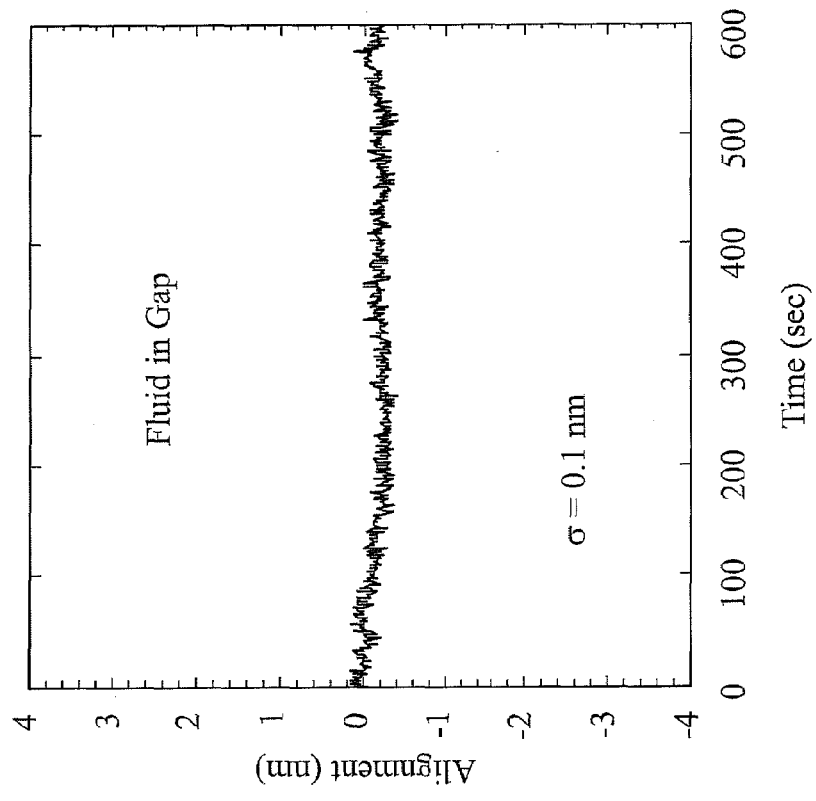
FIG. 7B is a graph illustrating fluid between the reference flat and substrate, producing hydrostatic vibration damping.
Figure 7A:
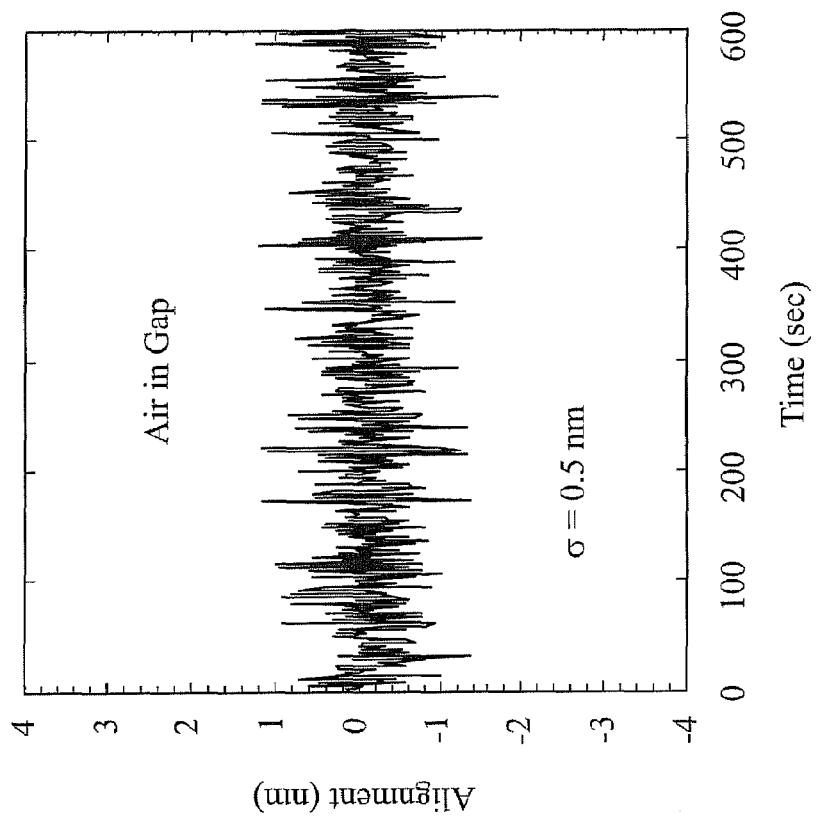
FIG. 7A is a graph illustrating the tip position data with air between the reference flat and substrate.

In FIG. 7, data illustrates the effect of such hydrostatic stabilization, which is, at a small gap, sufficient to reduce noise similar to that in FIG. 6B to the sub-nanometer level. In combination with ISPI tip control, both low- and high-speed position variations are corrected.

The fluid provides additional functionality, such as a transport and/or diffusion mechanism to remove debris generated by tip modification of the surface, thermal equalization of the reference flat, substrate, and tip, and chemical reactivity with various components or layers on the substrate. Use of the ISPI-controlled scanning tip in fluid also enables in vivo manipulation of biological samples, including tip interactions with DNA and cells.

In other embodiments of the invention, a plurality of probe tips is attached to the reference flat. Each tip can be raised or lowered individually by means of a piezo actuator attached to the reference flat, providing the ability to independently write multiple patterns at the same time. Arbitrary patterns can be generated in this way, with a proportional increase in writing speed over a single tip. As in previous embodiments, the position of the reference flat relative to the substrate is measured and controlled in all six degrees of freedom using ISPI microscopes. Deflection of each tip is measured with ISPI gapping marks while scanning over a mark; deflection is related to the voltage applied to each Z piezo, and the information used to map a voltage bias to each piezo to obtain consistent heights and constant applied tip force across the tip array during lithography.

Lateral positions of the tips upon the flat are calibrated with a sample write; the written features are compared with the intended locations, and a database is generated containing the differences. This database is used to modify the timing of writing locations (i.e., the location of interaction of the tip and substrate during the scan) of each tip to correct for any deviation of the tip writing locations from a perfect Cartesian grid.

When a plurality of tips are used with the reference flat, it is especially desirable to fabricate the flat from a transparent material with a low thermal expansion coefficient such as fused silica, which has an expansion of 0.57 parts per million per degree C. (Assuming a ~500 micron path length from the tip to the ISPI marks, fused silica for the reference flat material (0.57 ppm/° C.), yields a position disparity of 0.29 nm/° C. between the tip and marks. Thermal enclosures can control the temperature to reduce this disparity by a factor of 100, and may become necessary for large tip arrays.

Alternatively, position can be monitored at points across the tip array, using additional ISPI microscopes. Position information from the additional microscopes is used to detect thermal expansion between the flat and substrate, and eliminate thermal distortions from the lithographic pattern placement.

In certain cases it is advantageous to drive a tip at high frequencies (>100 kHz), at or near the resonant frequency of the cantilever, as is common in a non-contact imaging mode (or "tapping mode"). In a conventional scanning probe microscope, a laser beam is incident on a cantilever, and the reflected beam is detected by a split photodiode. Deflection of the cantilever causes movement of the reflected beam, which is measured by the difference between electrical signals from each side of the split photodiode. Sensitivity to deflection is proportional to the length of the lever arm provided by the reflected beam. In practice, the separation between the photodiode and the cantilever is several centimeters, and, as a result of the wide separation between the incident and reflected beams, the tip deflection sensing apparatus is typically ~10 cm wide.

Figure 8:
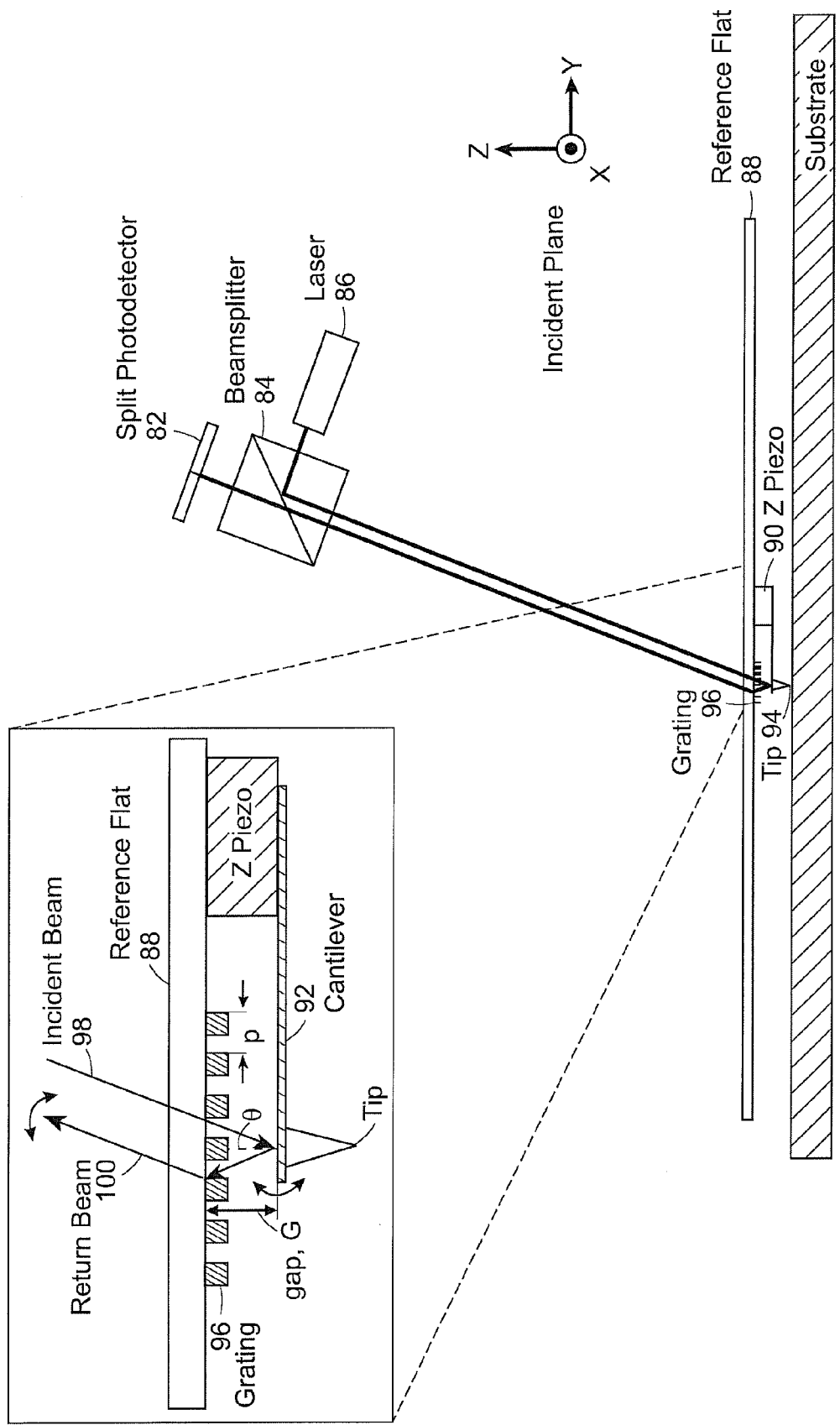
FIG. 8 is a schematic diagram illustrating oblique-incidence measurement of tip deflection.

In a further embodiment of the invention, high-frequency tip deflection is measured with a compact arrangement 80 of the incident and return beams, as illustrated in FIG. 8. A grating on a reference flat 88 returns a reflected beam from the cantilever 92 at the Littrow angle ($\theta_L = \sin^{-1}(\lambda/(2p))$), to a split photodetector. Deflections of the tip 94 cause related deflections of the return beam. Use of Littrow-angle backdiffraction allows the illumination source and photodetector to be emplaced in a more unified, compact assembly than in conventional scanning probe detectors.

In FIG. 8, a laser beam 98 from a laser light source 86 illuminates the backside of a tip 94 at oblique incidence after passage through a beamsplitter 84 and, in zero-order, through a grating 96, oriented with its k-vector in the plane defined by the surface normal of the reference flat 88 and the incident beam 98 (YZ plane in the diagram). The beam reflects off the cantilever 92 and back to the grating 96, where a diffracted component 100 returns at substantially the same angle as the incident beam 98. The return beam 100 passes through the beamsplitter 84 and is detected by a split photodiode 82. The Z piezo 90 drives the tip 94 into oscillations, typically at or near the resonant frequency of the cantilever 92. Tip deflection is detected at a 100 kilohertz rate, or above, by the corresponding deflection of the reflected/diffracted beam, as measured by the split photodetector 82.

An advantage of the method of sensing tip deflection shown in FIG. 8 is that the illumination source and detector can be much more compact than conventional detectors. Both the source and the detector in the invention are readily amenable to miniaturization: without the impediment of detecting only a reflected beam, a source and detector manufactured with off-the-shelf components can be housed in a package <1 cm on a side.

Observation of the tip and substrate using a normal-incidence optical microscope is readily permitted due to the geometry of the beam paths. The geometry of the beam paths also allows simultaneous observation and control of tip deflection during exposure of the substrate with ultraviolet light, as is useful for curing polymers applied to the substrate surface.

The cube beamsplitter depicted in FIG. 8 can be replaced by a thin membrane (e.g., a pellicle), or a grating, for a more compact arrangement.

Figure 9:
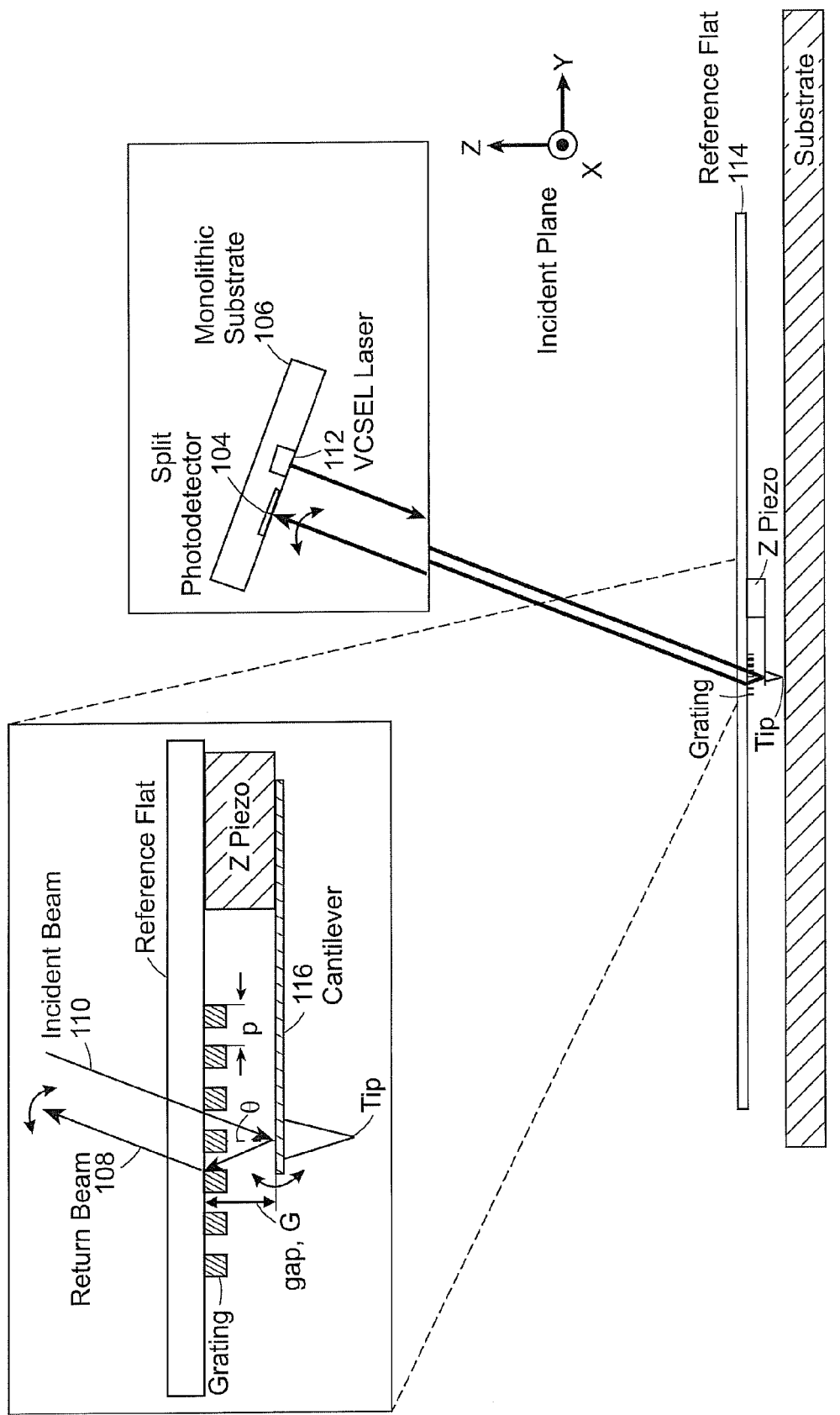
FIG. 9 is a schematic diagram illustrating a monolithic illuminator/detector for tip deflection.

In an alternative embodiment, the beamsplitter can be omitted entirely as shown in FIG. 9. In this case, the illumination source 112 and split photodetector 104 are fabricated in adjacent positions, and on the same surface, on a monolithic substrate 106. An array of such detectors is inherently amenable to miniaturization and mass fabrication, as in a semiconductor sensor array including vertical-cavity surface emitting lasers (VCSEL), which is employed in concert with a tip array containing many thousands of tips.

The spatial separation of the incident 110 and return beams 108, due to the gap between the reference flat 114 and the cantilever 116, in combination with the Littrow angle determined by the illumination wavelength and grating period, is matched to the spatial separation of the monolithic laser 112 and photodetector 104. In the configuration depicted in FIG. 9, the incident 110 and return 108 beams are both at the Littrow angle; alternatively, the incident beam 110 can be at a near-Littrow angle, resulting in a near-Littrow return beam 108, but at an equal and opposite angle with respect to the near-Littrow incident beam, as can be desirable to match a predetermined separation between the monolithic laser 112 and photodetector 104.

Arrays of multiple sources and detectors are fabricated on a single substrate, and aligned with arrays of multiple tips, allowing simultaneous high-frequency detection of tip arrays during microscopy and lithography. Use of such parallel arrays of detectors overcomes many of the obstacles previously encountered with parallel tip arrays: since individual tip positions in the array are sensed, individual feedback loops are maintained, in conjunction with the deflections caused by the array of Z piezos.

Figure 10:
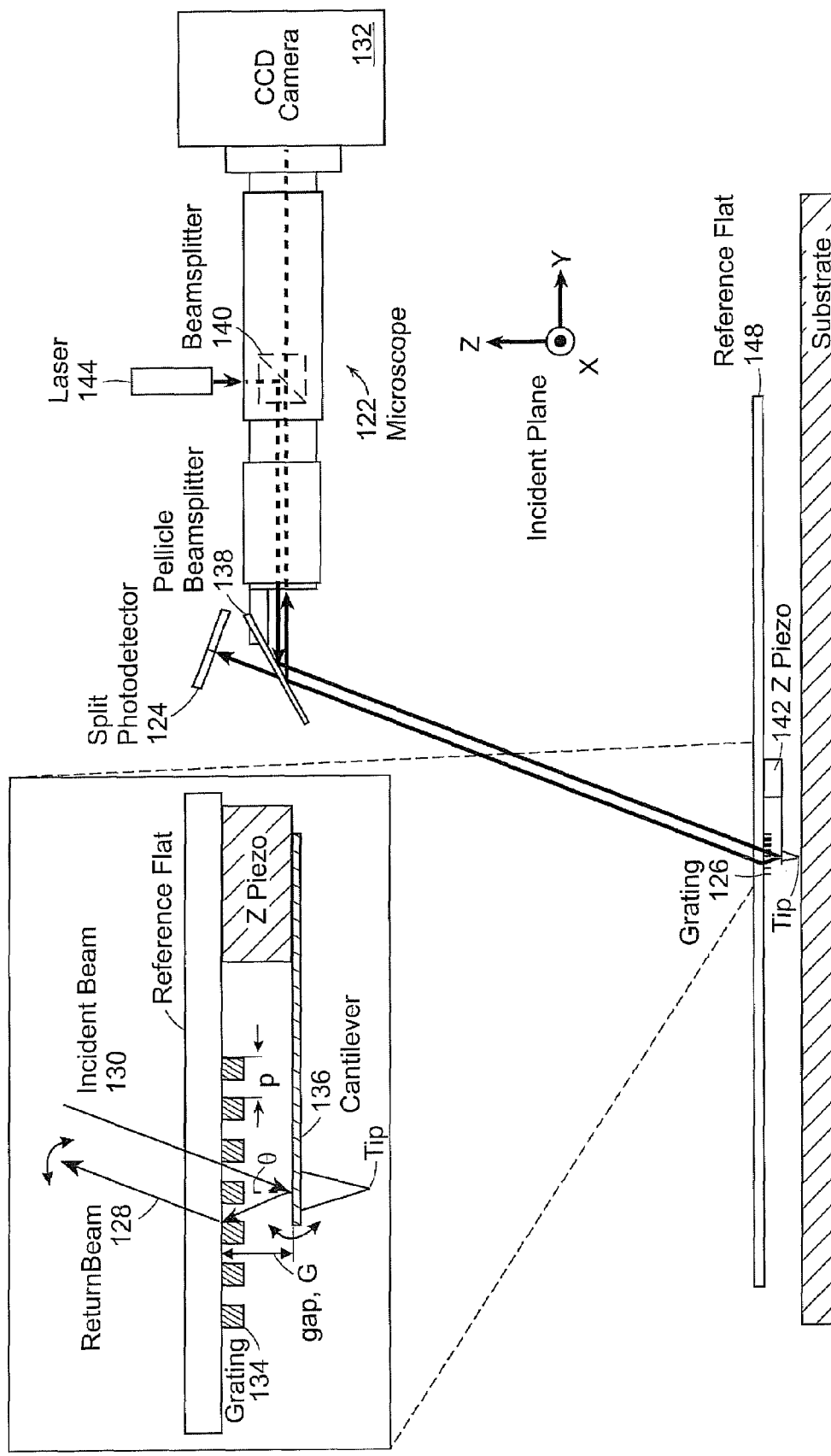
FIG. 10 is a schematic diagram illustrating a split photodiode integrated with an ISPI microscope.

Either of the above configurations can be combined with an ISPI microscope 122, as indicated in FIG. 10. The microscope 122 uses a laser 144 to provide incident light 130. The laser beam 130 illuminates the tip cantilever 136 at oblique incidence after reflection through beamsplitter 140 and reflection from beamsplitter 138 and, in zero-order, through a grating 134, oriented with its k-vector in the plane defined by the surface normal of the reference flat 148 and the incident beam 130 (YZ plane in the diagram).

The beam reflects off the cantilever 136 and back to the grating 134, where a diffracted component 128 returns at substantially the same angle as the incident beam 130. The return beam 128 passes through the pellicle beamsplitter 138 of the ISPI microscope 122 and is detected by a split photodiode 124. The Z piezo 142 drives the tip 126 into oscillations, typically at or near the resonant frequency of the cantilever 136. Tip deflection is detected at a 100 kilohertz rate, or above, by the corresponding deflection of the reflected/diffracted beam, as measured by the split photodetector 124.

The split photodiode 124 detects motion of the tip 126 by the geometric deflection of the return beam 128. Alternatively, the CCD camera 132 observes gap-dependent interference fringes from additional marks on the reference flat (not shown). The use of the split photodiode 124 and the standard ISPI imaging of alignment or gapping marks occur independently. The CCD 132 or split photodetector 124 are employed depending upon the type of mark, or marks being illuminated. Multiple mark types (i.e., ISPI aligning marks and gap marks) can be observed on the CCD 132 at the same time, in the same field of view.

This combination allows independent detection of tip deflection at high-frequencies, as well as low-frequency deflection measurements, gap measurements between the reference flat and substrate, gap measurements between the reference flat and cantilever, and tip-to-substrate alignment.

The embodiments of tip deflection sensing are equally compatible with tapping mode and the panoply of alternate scanning modes, such as contact mode, torsion resonance mode, lateral force microscopy, magnetic force microscopy, scanning tunneling microscopy, as apparent to one skilled in the art of scanning probe microscopy. In some of these modes, such a torsional mode, a quadrant photodetector may be substituted for a split photodetector.

In an alternative embodiment, ISPI alignment marks are attached to the base of the cantilever. In this embodiment, when ISPI is used with visible illumination, the alignment marks are attached to a transparent membrane, such as made of silicon nitride, with a region etched through the surrounding silicon base material. Alternatively, if ISPI is used with infrared illumination at a wavelength to which the base material is transparent, the alignment marks can be written directly on the cantilever base, without the numerous additional processing steps required to create a silicon nitride membrane. Further advantages when the alignment marks are attached directly to the cantilever base are a) greater mechanical stability of the alignment marks and b) lower measurement disparity due to thermal drift.

Considering high-frequency tip deflection measurement, in an alternative embodiment, a constant-period grating is written on the cantilever, preferably on a region of the cantilever directly above the tip. Illumination is incident at an oblique angle in the incident plane, but in this embodiment, the return beam is backdiffracted directly to a split photodetector. Tip deflection is measured by the deflection of the direct, backdiffracted beam on the split photodetector. When the illumination is at the Littrow angle, there is no separation of the incident and return beampaths, so a beamsplitter is typically used between the light source and detector.

Alternatively, when the illumination is at a near-Littrow angle, the return beam diffracts symmetrically on the opposite side of the Littrow angle. The near-Littrow configuration using a grating mark on the cantilever is compatible with adjacent lasers and photodetectors on a monolithic surface, as described in the previous section.

In these alternate mark emplacements, the reference flat is useful primarily as a mechanical support for a tip array.

In commonly employed template writing methods, such as electron beam lithography, feature placement accuracy within a single field is limited by non-linearities in the deflection coils, electron optics, deflection and field-calibration electronics, and stray magnetic fields. Such intrafield errors are non-uniform and non-linear, and typically amount to a few nanometers, but up to 10 nm or more near the edges of the field. In the invention, limits on tip placement accuracy are (a) detectivity of ISPI ($\sigma$=0.05 nm), (b) thermal drift in the mechanical path between the tip and the alignment marks on the reference flat (<1 nm/° C.), (c) ISPI mark distortions (<<1 nm), and (d) step size of the piezo actuator (0.05 nm).

In e-beam, a common problem is stitching error, which occurs between misaligned fields, and disrupts long-range placement accuracy, with a consequent degradation of functionality in devices that require lithography across multiple fields, such as photonic devices. In an e-beam system, to write features larger than a single field (typ. 100×100 µm) the substrate stage is moved under control of a laser interferometer: the stage is stepped between writing one field and the next, based on interferometric measurements referred to nominally flat mirrors that extend along the sides of the stage. Deviations in the mirror flatness can produce perturbations, as well as thermal expansion of the stage between the mirror and the substrate.

Typical specifications on commercial e-beam systems claim stitching errors of ~30 nm. In the invention, the relative position of the writing instrument and the substrate is measured more directly. Tip position is always referenced to the substrate, not to the stage holding the substrate, reducing drift and other errors to the nanometer or sub-nanometer level. Unlike e-beam, long-range accuracy in the invention is not dependent upon deviations between a substrate, stage, and interferometer, but is constrained primarily by the size and accuracy of the ISPI marks. Using various forms of interferometric lithography for production of fiducial references and spatial-phase locked e-beam lithography, the region of high pattern placement accuracy can extend over very large areas, potentially as large as the entire substrate.

E-beam resolution is limited in part by mutual repulsion between charged particles in the beam, line-edge roughness due to statistical variations in dose, and proximity effects in the resist due to electron scattering. At low beam current (and correspondingly low throughput), the FWHM of the Gaussian beam is on the order of 10 nm. Typical exposed features are in the 15-20 nm range. In any form of scanning probe lithography, feature size is strongly correlated with tip size, which commonly can have a tip radius of 1 nm. Given that the tip size is a constant, independent of the scanning rate, suggests that throughput can be increased, while maintaining high resolution.

In an e-beam system, the minimum step size is determined by the D/A converters that operate the deflection coils. Commonly, a 16-bit D/A is used, providing a maximum of 1.5 nm resolution over a 100 μm field. Since this represents a small fraction of the beam diameter (minimum 5-10 nm) it is a reasonable limit for e-beam. The minimum step size in the invention is limited by the step size of the XY piezo (0.05 nm).

The higher writing speed of an e-beam is mitigated by the facility with which the invention can be utilized with a plurality of tips; i.e., the reference flat can operate well with one tip or many thousands of tips.

Many of the characteristics described here for e-beam lithography are also applicable to other charged-particle beams, such as helium ion beams.

Although the present invention has been shown and described with respect to several preferred embodiments thereof, various changes, omissions and additions to the form and detail thereof, may be made therein, without departing from the spirit and scope of the invention.

What is claimed is:

1. An interferometric-spatial-phase imaging (ISPI) system comprising:
   an alignment mechanism for obtaining continuous six-axis control of a scanning probe tip with respect to a coordinate system attached to a substrate;
   a gap detection mechanism for measuring tip height above the substrate and controlling tip approach toward the substrate of one or more tips, as well as measuring tip deflection during surface contact of said one or more tips;
   a plurality of marks for alignment and gap control of the one or more tips relative to the substrate, as well as for orientation of the one or more tips;
   a plurality of complementary marks for alignment on said substrate; and
   a plurality of grating marks to backdiffract a reflected beam from a flexible cantilever to detect high-frequency tip deflection in a compact configuration of a light source and a light detector.

2. The ISPI system of claim 1, wherein said light source and said light detector are integrated into a monolithic tip deflection-sensing device.

3. The ISPI system of claim 2, wherein said one or more tips comprise a tip array for said monolithic tip deflection sensors to simultaneously measure and control deflection throughout said tip array.

4. The ISPI system of claim 3, wherein said tip array is used for ISPI-controlled parallel lithography of arbitrary features over large areas.

5. The ISPI system of claim 3, wherein said tip array is used for ISPI-controlled parallel microscopy and defect analysis of lithographic features over large areas.

6. The ISPI system of claim 1, wherein said tip deflection-sensing device is used for generating high-accuracy, large-area scanning-probe images.

7. The ISPI system of claim 1, wherein said alignment mechanism comprises a plurality of ISPI alignment marks to measure lateral tip position.

8. The ISPI system of claim 7, wherein said alignment mechanism comprises alternate emplacement of the ISPI alignment marks on a reference flat.

9. The ISPI system of claim 7, wherein said alignment mechanism comprises alternate emplacement of the ISPI alignment marks on the base of said cantilever.

10. The ISPI system of claim 7, wherein said ISPI alignment marks are compatible with microscopes used for overlay of imprint templates and substrates.

11. The ISPI system of claim 1, wherein said grating marks comprises alternate emplacement of said grating marks on a cantilever for sensing high-frequency tip deflection.

12. A scanning microscope comprising:
   an alignment mechanism for obtaining continuous six-axis control of a scanning probe tip with respect to a coordinate system attached to a substrate.
   a gap detection mechanism for measuring tip height above the substrate and controlling tip approach toward the substrate of one or more tips, as well as measuring tip deflection during surface contact of said one or more tips;
   a plurality of marks for alignment and gap control of the one or more tips relative to the substrate, as well as for orientation of the one or more tips;
   a plurality of complementary marks for alignment on said substrate; and
   a plurality of grating marks to backdiffract a reflected beam from a flexible cantilever to detect high-frequency tip deflection in a compact configuration of a light source and a light detector.

13. The scanning microscope of claim 12, wherein said light source and said light detector are integrated into a monolithic tip deflection-sensing device.

14. The scanning microscope of claim 13, wherein said one or more tips comprise a tip array for said monolithic tip deflection sensors to simultaneously measure and control deflection throughout said tip array.

15. The scanning microscope of claim 14, wherein said tip array is used for ISPI-controlled parallel lithography of arbitrary features over large areas.

16. The scanning microscope of claim 14, wherein said tip array is used for ISPI-controlled parallel microscopy and defect analysis of lithographic features over large areas.

17. The scanning microscope of claim 12, wherein said tip deflection-sensing device is used for generating high-accuracy, large-area scanning-probe images.

18. The scanning microscope of claim 12, wherein said alignment mechanism comprises a plurality of ISPI alignment marks to measure lateral tip position.

19. The scanning microscope of claim 18, wherein said alignment mechanism comprises alternate emplacement of the ISPI alignment marks on a reference flat.

20. The scanning microscope of claim 18, wherein said alignment mechanism comprises alternate emplacement of the ISPI alignment marks on the base of said cantilever.

21. The scanning microscope of claim 18, wherein said ISPI alignment marks are compatible with microscopes used for overlay of imprint templates and substrates.

22. The scanning microscope of claim 12, wherein said grating marks comprises alternate emplacement of said grating marks on a cantilever for sensing high-frequency tip deflection.

23. A method of interferometric-spatial-phase imaging comprising:
 obtaining continuous six-axis control of a scanning probe tip with respect to a coordinate system attached to a substrate with an alignment mechanism;
 measuring tip height above the substrate and controlling tip approach toward the substrate of one or more tips, as well as measuring tip deflection during surface contact of said one or more tips with a gap detection mechanism;
 providing a plurality of marks for alignment and gap control of the one or more tips relative to the substrate, as well as for orientation of the one or more tips;
 providing a plurality of complementary marks for alignment on said substrate; and
 providing a plurality of grating marks to backdiffract a reflected beam from a flexible cantilever to detect high-frequency tip deflection in a compact configuration of a light source and a light detector.

24. The method of claim 23, wherein said light source and said light detector are integrated into a monolithic tip deflection-sensing device.

25. The method of claim 24, wherein said one or more tips comprise a tip array for said monolithic tip deflection sensors to simultaneously measure and control deflection throughout said tip array.

26. The method of claim 25, wherein said tip array is used for ISPI-controlled parallel lithography of arbitrary features over large areas.

27. The method of claim 25, wherein said tip array is used for ISPI-controlled parallel microscopy and defect analysis of lithographic features over large areas.

28. The method of claim 23, wherein said tip deflection-sensing device is used for generating high-accuracy, large-area scanning-probe images.

29. The method of claim 23, wherein said obtaining continuous six-axis control comprises providing a plurality of ISPI alignment marks to measure lateral tip position.

30. The method of claim 29, wherein said obtaining continuous six-axis control comprises alternate emplacement of the ISPI alignment marks on a reference flat.

31. The method of claim 29, wherein said alignment mechanism comprises alternate emplacement of the ISPI alignment marks on the base of said cantilever.

32. The method of claim 27, wherein said ISPI alignment marks are compatible with microscopes used for overlay of imprint templates and substrates.

33. The method of claim 23, wherein said grating marks comprises alternate emplacement of said grating marks on a cantilever for sensing high-frequency tip deflection.

* * * * *